United States Patent
Lu et al.

(10) Patent No.: US 10,128,799 B2
(45) Date of Patent: Nov. 13, 2018

(54) MULTI-FREQUENCY TUNABLE LOW NOISE AMPLIFIER AND MULTI-FREQUENCY TUNING IMPLEMENTATION METHOD THEREFOR

(71) Applicant: ZTE Corporation, Shenzhen, Guangdong (CN)

(72) Inventors: Xiaozheng Lu, Shenzhen (CN); Shaowu Shen, Shenzhen (CN)

(73) Assignee: ZTE Corporation, Shenzhen, Guangdong (CN)

( * ) Notice: Subject to any disclaimer, the term of this patent is extended or adjusted under 35 U.S.C. 154(b) by 0 days.

(21) Appl. No.: 15/514,144

(22) PCT Filed: Jul. 30, 2015

(86) PCT No.: PCT/CN2015/085621
§ 371 (c)(1),
(2) Date: Mar. 24, 2017

(87) PCT Pub. No.: WO2016/045449
PCT Pub. Date: Mar. 31, 2016

(65) Prior Publication Data
US 2017/0294884 A1  Oct. 12, 2017

(30) Foreign Application Priority Data
Sep. 25, 2014  (CN) .......................... 2014 1 0497124

(51) Int. Cl.
*H03F 1/26* (2006.01)
*H03F 3/191* (2006.01)
(Continued)

(52) U.S. Cl.
CPC .............. *H03F 1/26* (2013.01); *H03F 1/0205* (2013.01); *H03F 1/30* (2013.01); *H03F 1/56* (2013.01);
(Continued)

(58) Field of Classification Search
USPC .......................... 330/302, 285, 296–297, 305
See application file for complete search history.

(56) References Cited

U.S. PATENT DOCUMENTS 7,495,515 B1 * 2/2009 Branch ..................... H03F 1/56
                                                        330/302
8,977,216 B2   3/2015 Weissman
(Continued)

FOREIGN PATENT DOCUMENTS

CN         1825757 A    8/2006
CN         1954489 A    4/2007
(Continued)

OTHER PUBLICATIONS

International Search Report in international application No. PCT/CN2015/085621, dated Oct. 29, 2015, 2 pgs.
(Continued)

*Primary Examiner* — Hieu Nguyen
(74) *Attorney, Agent, or Firm* — Cooper Legal Group, LLC

(57) ABSTRACT

A multi-frequency tunable low-noise amplifier and a multi-frequency tuning implementation method therefor. The amplifier comprises: a system controller (13) and a micro-electro-mechanical system (MEMS) matching tuner (12) connected to the system controller (13). The system controller (13) is configured to respond to a first operation executed by a user via a user interface (15) when in a first mode, to acquire a first matching value produced on the basis of the first operation, and to output the first matching value to the MEMS matching tuner (12). The MEMS matching tuner (12) is configured to be controlled by the system controller (13) and to support the amplifier working on different frequency bands in tuning processing, thus
(Continued)

allowing the matching value of the MEMS matching tuner (12) itself to match a current working frequency band.

12 Claims, 3 Drawing Sheets

(51) Int. Cl.
*H03F 1/56* (2006.01)
*H03F 1/02* (2006.01)
*H03F 1/30* (2006.01)

(52) U.S. Cl.
CPC ........ *H03F 3/191* (2013.01); *H03F 2200/111* (2013.01); *H03F 2200/294* (2013.01); *H03F 2200/387* (2013.01); *H03F 2200/459* (2013.01)

(56) References Cited

U.S. PATENT DOCUMENTS

| | | | |
|---|---|---|---|
| 9,002,309 | B2 | 4/2015 | Sahota |
| 9,318,801 | B2* | 4/2016 | Judson ................ H01Q 1/50 |
| 2006/0189286 | A1 | 8/2006 | Kyu |
| 2007/0216486 | A1 | 9/2007 | Ismail |
| 2012/0302188 | A1 | 11/2012 | Sahota |
| 2013/0244591 | A1 | 9/2013 | Weissman |
| 2014/0002190 | A1 | 1/2014 | Marsan et al. |

FOREIGN PATENT DOCUMENTS

| | | |
|---|---|---|
| CN | 102122932 A | 7/2011 |
| CN | 103166577 A | 6/2013 |
| CN | 103227612 A | 7/2013 |
| CN | 103563261 A | 2/2014 |

OTHER PUBLICATIONS

English Translation of the Written Opinion of the International Search Authority in international application No. PCT/CN2015/085621, dated Oct. 29, 2015, 7 pgs.

International Search Report in international application No. PCT/CN2015/076203, dated Jun. 30, 2015, 2 pgs.

English Translation of the Written Opinion of the International Search Authority in international application No. PCT/CN2015/076203, dated Jun. 30, 2015, 6 pgs.

"RF MEMS Based Impedance Matching Networks for Tunable Multi Band Microwave Low Noise Amplifiers", R. Malmqvist, P. Rantakari, C. Samuelsson, M. Lahti, S. Cheng, J. Saijets, T. Vaha-Heikkits, A. Rydberg and J. Varis, Dec. 7, 2009, 2009 IEEE International Semiconductor Conference, pp. 303-306.

* cited by examiner

MULTI-FREQUENCY TUNABLE LOW NOISE AMPLIFIER AND MULTI-FREQUENCY TUNING IMPLEMENTATION METHOD THEREFOR

TECHNICAL FIELD

The disclosure relates to the technology of tuning, and in particular to a multi-frequency tunable low noise amplifier and a method for performing multi-frequency tuning of the multi-frequency tunable low noise amplifier.

BACKGROUND

The inventors of the present application have found at least the following technical problems in the related art in the process of implementing the technical solution of the embodiment of the present application.

For a communication receiving system, the noise factor and gain of a first stage circuit behind an antenna determines the receiving sensitivity of the entire system, and the use of a Low Noise Amplifier (LNA) herein not only amplifies weak received signals, but also its low noise factor also determines the noise factor of the entire system and improves receiving performance.

To make the LNA operate under the best noise performance, impedance matching is required to be performed on its input end, so that after impedance matching, the input impedance achieves an optimum value for noise characteristics of transistors used in the LNA; if matching is not performed for the best noise factor, the noise performance of the LNA cannot be fully developed, thereby reducing the receiving sensitivity, and thus reducing the receiving performance of the entire receiving system.

With the development of the modern communication system, it is required that the communication reception system often operates in multiple frequency bands, such as CDMA, WCDMA, GSM, GPS, WLAN, etc. If it is required to ensure that multiple receivers can operate in the best condition in multiple frequency bands, it is undoubted that the complexity of the circuit design will be increased. However, the development of the modern wireless communication system also presents a trend of miniaturization and portable-type, and the space for circuit design has been compressed. The circuit has increasingly improved requirement on circuit integration.

However, in the prior art, various mobile communication receiving systems often employ multiple LNAs with multiple operating characteristics in different frequency bands to enable an receiver to have good receiving performance on different frequency bands. This requires that a corresponding input and output matching circuit is designed for an LNA operating in a respective frequency band, that is to way, an LNA operating in multiple different operating frequency bands needs to be provided with multiple peripheral devices such as input and output matching circuits, otherwise, matching of different operating frequency bands cannot be achieved, resulting in the following problem.

The use of T-type or π-type matching network will increase the number of such peripheral devices. Even if devices with 0201 package are used, it will greatly increase the area of the external matching circuit; and an increase in the complexity of the matching circuit will directly affect the difficulty of PCB layout, thus improve the possibility that problems such as interference, impedance mismatch and so on are introduced into the circuit.

In short, the prior art cannot solve the contradictions between the performance of the receiving system and the hardware complexity. For this problem, the related art has not proposed effective solutions.

SUMMARY

In view of the above, embodiments of the disclosure are intended to provide a multi-frequency tunable low noise amplifier and a method for performing multi-frequency tuning implementation method of the multi-frequency tunable low noise amplifier, which are capable of avoiding the contradictions between the performance of the receiving system and the hardware complexity, and implementing multi-frequency tunable processing on the low noise amplifier without improving the hardware complexity, to ensure the performance of the receiving system.

The technical solutions of the disclosure are implemented as follows.

An embodiment of the disclosure provides a multi-frequency tunable low noise amplifier, including: a system controller and a Micro-Electro-Mechanical System (MEMS) matching tuner connected with the system controller;

herein the system controller is arranged to, during a first mode, respond to a first operation implemented by a user via a user interface, to acquire a first matching value obtained according to the first operation, and to output the first matching value to the MEMS matching tuner; and the MEMS matching tuner is arranged to be controlled by the system controller, and to perform tuning processing on the amplifier supporting operation in different frequency bands according to the first matching value, so that a matching value of the MEMS matching tuner matches a current operating frequency band.

In an embodiment, the amplifier may further include:

a wideband low noise amplifier arranged to, under the control of the MEMS matching tuner, perform input impedance matching by the tuning processing that allows the matching value to match the current operating frequency band, so as to support operation in a plurality of different operating frequency bands.

In an embodiment, the amplifier may further include:

a variable circuit bias module arranged to perform a bias fine tuning on the wideband low noise amplifier; and/or a voltage ripple filtering module arranged to perform a voltage fine tuning on the wideband low noise amplifier.

The system controller, the MEMS matching tuner, the wideband low noise amplifier, the variable circuit bias module, and the voltage ripple filtering module may be implemented by a Central Processing Unit (CPU), a Digital Signal Processor (DSP), or a Programmable Logic Array (FPGA) when implementing processing.

An embodiment of the disclosure further provides a method for performing multi-frequency tuning of a multi-frequency tunable low noise amplifier, the method including:

when detecting it is in a first mode, a system controller responds to a first operation implemented by a user via a user interface to acquire a first matching value obtained according to the first operation;

the system controller outputs the first matching value to an MEMS matching tuner; and the MEMS matching tuner under the control of the system controller performs tuning processing on the amplifier supporting operation in different frequency bands according to the first matching value, so that a matching value of the MEMS matching tuner matches a current operating frequency band.

In an embodiment, the method may further include:

a wideband low noise amplifier performs, under the control of the MEMS matching tuner, input impedance matching by the tuning processing that allows the matching value to match the current operating frequency band, so as to support operation in a plurality of different operating frequency bands.

In an embodiment, the method may further include:

a fine tuning is performed on each bias value according to a current gain, noise factor and power consumption of a wideband low noise amplifier until an optimal operating point is reached.

In an embodiment, the method may further include:

multiple-stage fine-tuning variable-capacitance filtering is performed on a ripple of a current external power supply voltage according to the current external power supply voltage and its ripple state until voltage fluctuation does not exceed +/−1% of the supply voltage so as to acquire most noise-free and stable voltage power supply.

An embodiment of the disclosure further provides a multi-frequency tunable low noise amplifier, and the amplifier includes:

a system controller arranged to, during a second mode, acquire a second matching value corresponding to a current operating frequency band from pre-configured information, and to output the second matching value to an MEMS matching tuner; and the MEMS matching tuner arranged to be controlled by the system controller, and to perform tuning processing on the amplifier supporting operation in different frequency bands according to the second matching value so that a matching value of the MEMS matching tuner matches the current operating frequency band.

In an embodiment, the amplifier may further include:

a wideband low noise amplifier arranged to, under the control of the MEMS matching tuner, perform input impedance matching by the tuning processing that allows the matching value to match the current operating frequency band, so as to support operation in a plurality of different operating frequency bands.

In an embodiment, the amplifier may further include:

a variable circuit bias module arranged to perform a bias fine tuning on the wideband low noise amplifier; and/or a voltage ripple filtering module arranged to perform a voltage fine tuning on the wideband low noise amplifier.

An embodiment of the disclosure further provides a method for performing multi-frequency tuning of a multi-frequency tunable low noise amplifier, the method including:

when detecting it is in a second mode, a system controller acquires a second matching value corresponding to a current operating frequency band from pre-configured information;

the system controller outputs the second matching value to an MEMS matching tuner; and the MEMS matching tuner under the control of the system controller performs tuning processing on the amplifier supporting operation in different frequency bands according to the first matching value, so that a matching value of the MEMS matching tuner matches the current operating frequency band.

In an embodiment, the method may further include:

a wideband low noise amplifier performs, under the control of the MEMS matching tuner, input impedance matching by the tuning processing that allows the matching value to match the current operating frequency band, so as to support operation in a plurality of different operating frequency bands.

In an embodiment, the method may further include:

a fine tuning is performed on each bias value according to a current gain, noise factor and power consumption of a wideband low noise amplifier until an optimal operating point is reached.

In an embodiment, the method may further include:

multiple-stage fine-tuning variable-capacitance filtering is performed on a ripple of a current external power supply voltage according to the current external power supply voltage and its ripple state until voltage fluctuation does not exceed +/−1% of the supply voltage so as to acquire most noise-free and stable voltage power supply.

The system controller, the MEMS matching tuner, the wideband low noise amplifier, the variable circuit bias module, and the voltage ripple filtering module may be implemented by a CPU, a DSP, or a FPGA when implementing processing.

The amplifier according to embodiments of the disclosure includes: a system controller and an MEMS matching tuner connected with the system controller; the system controller is arranged to, during a first mode, respond to a first operation implemented by a user via a user interface, to acquire a first matching value obtained according to the first operation, and to output the first matching value to the MEMS matching tuner; the MEMS matching tuner is arranged to be controlled by the system controller, and to perform tuning processing on the amplifier supporting operation in different frequency bands according to the first matching value so that a matching value of the MEMS matching tuner matches a current operating frequency band. In the embodiments of the disclosure, it is possible to avoid the contradictions between the performance of the receiving system and the hardware complexity, and implement multi-frequency tunable processing on the low noise amplifier without improving the hardware complexity, to ensure the performance of the receiving system.

DETAILED DESCRIPTION

The implementation of the technical solution will be described in further detail below with reference to the accompanying drawings.

The embodiments of the disclosure provide a multi-frequency tunable low noise amplifier, which is flexible in design, simple in PCB layout, and convenient in hardware debug, and an implementation method therefor. The embodiments of the disclosure are applicable to various communication receiving systems, and signals of multiple frequency bands can be received by a same LNA without the need to adding a corresponding matching circuit. The LNA itself adaptively matches the corresponding frequency bands, so that it is possible to adaptively receive signals from a plurality of frequency bands through the same LNA. Furthermore, the receiving performance of the communication system is always in the optimal state without increasing the complexity of the circuits, thus solving the contradictions between the performance of the modern mobile communication receiving system and the hardware complexity.

In addition, in the prior art, an input and output matching circuit is provided for each LNA of the plurality of LNAs in a one-to-one or one-to-many, which will greatly increase the time and the difficulty for the developer to debug a RF hardware circuit and increase the product development cycle and development cost. With the embodiments of the disclosure, there is no such problem.

Figure 1:
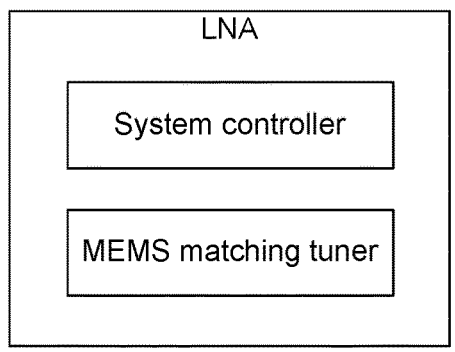
FIG. 1 is a schematic diagram showing a basic structure of an amplifier according to an embodiment of the disclosure.

An embodiment of the disclosure provides a multi-frequency tunable low noise amplifier. As shown in FIG. 1, the amplifier includes: a system controller and an MEMS matching tuner connected with the system controller; the system controller is arranged to, during a first mode, respond to a first operation implemented by a user via a user interface, to acquire a first matching value obtained according to the first operation, and to output the first matching value to the MEMS matching tuner; and the MEMS matching tuner is arranged to be controlled by the system controller, and to perform tuning processing on the amplifier supporting operation in different frequency bands according to the first matching value so that a matching value of the MEMS matching tuner matches a current operating frequency band.

In a preferred embodiment of the disclosure, the amplifier may further include:

a wideband low noise amplifier arranged to, under the control of the MEMS matching tuner, perform input impedance matching by the tuning processing that allows the matching value to match the current operating frequency band, so as to support operation in a plurality of different operating frequency bands.

In a preferred embodiment of the disclosure, the amplifier may further include:

a variable circuit bias module arranged to perform a bias fine tuning on the wideband low noise amplifier; and/or a voltage ripple filtering module arranged to perform a voltage fine tuning on the wideband low noise amplifier.

Figure 2:
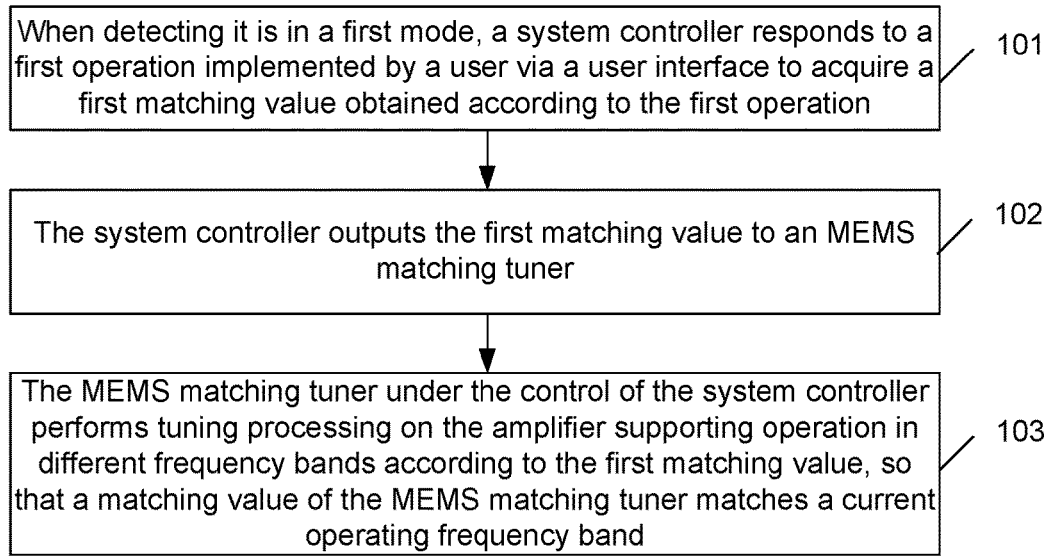
FIG. 2 is a schematic flow diagram showing an implementation principle of a method embodiment according to the disclosure.

The embodiment of the disclosure provides a method for performing multi-frequency tuning of a multi-frequency tunable low noise amplifier. As shown in FIG. 2, the method includes the following steps.

Step 101: When detecting it is in a first mode, a system controller responds to a first operation implemented by a user via a user interface to acquire a first matching value obtained according to the first operation.

Step 102: The system controller outputs the first matching value to an MEMS matching tuner.

Step 103: The MEMS matching tuner under the control of the system controller performs tuning processing on the amplifier supporting operation in different frequency bands according to the first matching value, so that a matching value of the MEMS matching tuner itself matches a current operating frequency band.

In a preferred embodiment of the disclosure, the method may further include:

a wideband low noise amplifier performs, under the control of the MEMS matching tuner, input impedance matching by the tuning processing that allows the matching value to match the current operating frequency band, so as to support operation in a plurality of different operating frequency bands.

In a preferred embodiment of the disclosure, the method may further include:

a fine tuning is performed on each bias value according to a current gain, noise factor and power consumption of a wideband low noise amplifier until an optimal operating point is reached.

In a preferred embodiment of the disclosure, the method may further include:

multiple-stage fine-tuning variable-capacitance filtering is performed on a ripple of a current external power supply voltage according to the current external power supply voltage and its ripple state until it meets a threshold so as to acquire most noise-free and stable voltage power supply.

The embodiment of the disclosure provides a multi-frequency tunable low noise amplifier, the amplifier includes:

the system controller arranged to, during a second mode, acquire a second matching value corresponding to the current operating frequency band from the pre-configured information according to the current operating frequency band mode, and to output the second matching value to an MEMS matching tuner; and the MEMS matching tuner arranged to be controlled by the system controller, and to perform tuning processing on the amplifier supporting operation in different frequency bands according to the second matching value so that a matching value of the MEMS matching tuner matches a current operating frequency band.

In a preferred embodiment of the disclosure, the amplifier may further include:

a wideband low noise amplifier arranged to, under the control of the MEMS matching tuner, perform input impedance matching by the tuning processing that allows the matching value to match the current operating frequency band, so as to support operation in a plurality of different operating frequency bands.

In a preferred embodiment of the disclosure, the amplifier may further include:

a variable circuit bias module arranged to perform a bias fine tuning on the wideband low noise amplifier; and/or a voltage ripple filtering module arranged to perform a voltage fine tuning on the wideband low noise amplifier.

The embodiment of the disclosure provides a method for implementing multi-frequency tuning of a multi-frequency tunable low noise amplifier, the method including the following steps.

When detecting it is in a second mode, a system controller acquires a second matching value corresponding to the current operating frequency band from the pre-configured information according to the current operating frequency band.

The system controller outputs the second matching value to an MEMS matching tuner.

The MEMS matching tuner under the control of the system controller performs tuning processing on the amplifier supporting operation in different frequency bands according to the first matching value, so that a matching value of the MEMS matching tuner matches a current operating frequency band.

In a preferred embodiment of the disclosure, the method may further include:

a wideband low noise amplifier performs, under the control of the MEMS matching tuner, input impedance matching by the tuning processing that allows the matching value to match the current operating frequency band, so as to support operation in a plurality of different operating frequency bands.

In a preferred embodiment of the disclosure, the method may further include:

a fine tuning is performed on each bias value according to a current gain, noise factor and power consumption of a wideband low noise amplifier until an optimal operating point is reached.

In a preferred embodiment of the disclosure, the method may further include:

multiple-stage fine-tuning variable-capacitance filtering is performed on a ripple of a current external power supply voltage according to the current external power supply voltage and its ripple state until it meets a threshold so as to acquire most noise-free and stable voltage power supply.

In summary, the embodiment of the disclosure mainly includes the following content.

From the perspective of an amplifier, the embodiment of the disclosure include a wideband low noise amplifier, an MEMS matching tuner, a variable circuit bias module, a voltage ripple filtering module, a system control module, a matching state memory, and a user interface.

The wideband low noise amplifier uses a wideband amplifier with a low noise factor in the range of a wide bandwidth, and the low noise amplifier can flexibly operate in multiple different frequency bands based on the requirement.

The MEMS matching tuner is connected with a passive part of an front end of the receiver, and tunes, for the low noise amplifier, a matching circuit with different best noise factors when the receiving system needs to operate in different frequency bands.

The variable circuit bias module, connected with the MEMS matching tuner, is arranged to change the external bias circuit unit of the LNA, which determines the direct current operating point of the LNA, so as to change the gain and noise factor of the LNA and reduce the power consumption. If the bias circuit of the LNA is not appropriate, the linearity of the LNA will not be good, and the relevant Noise Factor (NF) will be great thereby reducing the sensitivity of the entire system. The bias module of the LNA, i.e., the variable circuit bias module, includes a variable resistor, a variable capacitor, and a fixed inductor. Specifically, the variable capacitor can use a built-in capacitor of the MEMS matching tuner. By monitoring the performance parameters of the LNA, the variable resistor and the bias circuit of the variable resistor are fine tuned to acquire a matching value allowing an optimal LNA performance.

The voltage ripple filtering module connected with the MEMS matching tuner, is arranged to improve the stability and provide low noise of the LNA power supply circuit. The power supply circuit of the LNA is critical to the impact of LNA performance, and a power supply circuit with a small ripple, high precision and low noise is particularly important. According to the voltage stability and ripple accuracy requirement of the LNA, because the circuit load resistance value is known, the filter capacitance value can be calculated by testing the frequency of the signal to be filtered, and the corresponding relationship is stored in the matching state memory. Herein, the voltage ripple filtering module adopts an array of multi-level capacitance-variable filtering capacitors to remove the various ripple of the power supply of the LNA and provide the stable and noise-free input voltage. The multi-level capacitance-variable capacitor covers ranges of large, medium or small capacitance. The capacitance in each range can be adjusted in steps within a certain range of capacitance value.

The system controller calls or stores the matching values that need to be used from the matching state memory, and controls the MEMS matching tuners to use different matching states.

The matching state memory stores the matching value recorded by a user, provides the system controller to call at any time, and stores a corresponding change table of a voltage ripple and a filter arranged to be adjusted by the supply voltage.

The user interface provides the matching value debugged on the PC and records the matching values to the interactive interface of the system on demand.

Compared with the prior art, the embodiment of the disclosure does not use a discrete low noise amplifier and a plurality of different matching circuits in which a plurality of narrow bands operate in a single frequency for a plurality of frequency bands, instead of using a wideband low noise amplifier combined with a tuning module so that the same low noise amplifier can be flexibly used in the receiver of the combination of many different frequency bands; here the amplifier is located in the receiver and located in the most front of the receiver, and it is a device before the mixer that has the maximum influence and a decisive effect on the noise factor of the system, reaching the effect that: for the LNA and bandpass filter (BPF), the noise factor of the LNA should be as small as possible, and bpf insertion loss should be as small as possible.

In addition, this design achieves the matching of a wideband low noise amplifier through the micro-electromechanical technology of the MEMS, so that while being flexible and tunable, the matching greatly improves the integration of the receiving system, and makes full use of the characteristics that the MEMS technology has a low power consumption, in line with the requirement that the modern mobile communication system pursues low power consumption; moreover, the disclosure provides a user debugging interface, so that developers only need to debug the match of the low noise amplifier on the PC, so as to achieve the debugging of the system sensitivity, greatly simplifying the difficulty of hardware debugging and reducing the debugging cost and time.

The embodiment of the disclosure will be described in detail below.

Figure 3:
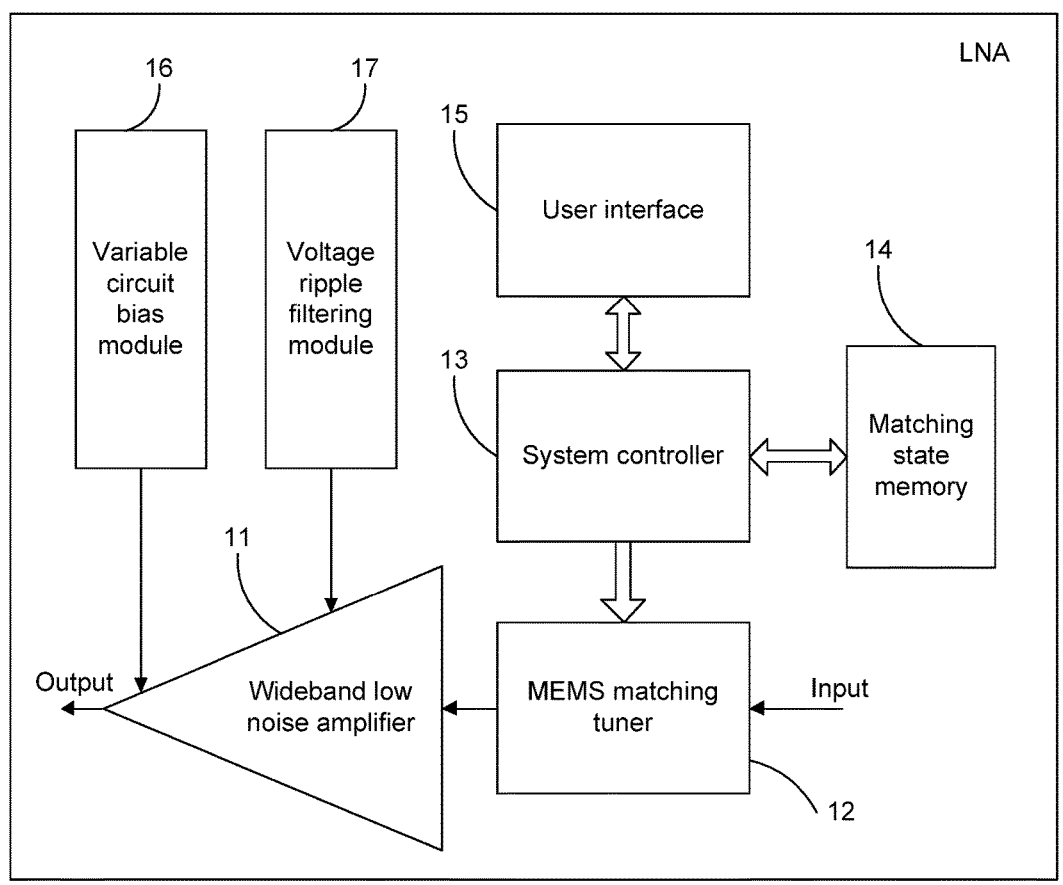
FIG. 3 is a specific structure diagram of a multi-frequency tunable low noise amplifier to which an embodiment of the disclosure is applied.

FIG. 3 is a structure diagram of a multi-frequency tunable low noise amplifier according to the disclosure. The two scenes of the first mode and the second mode are combined. The first mode can be a developer debug mode, and the second mode is a non-developer debug mod. In the developer debug mode, the MEMS matching tuner acquires the matching value through the input operation of the user interface, and performs tuning processing according to the matching value after being controlled by the system controller; while in the non-developer debug mode, the matching value acquired by the MEMS matching the tuner is acquired from the pre-configuration information in the matching state memory, and performs tuning processing according to the matching value after being controlled by the system controller.

As shown in FIG. 3, the input signal enters the wideband low noise amplifier 11 via the MEMS matching tuner 12.

The system controller 13 provides the desired adjustment matching value for the MEMS matching tuner 12 via the user interface 15, or the system controller 13 controls the MEMS matching tuner 12 according to the matching values called from the matching state memory 14 by the current operating frequency band of the receiver, so that the matching value of the MEMS matching tuner 12 can match the current operating frequency band, and the wideband low noise amplifier 11 can perform a bias fine tuning and a voltage fine tuning, respectively, by the variable circuit bias module 16 and the voltage ripple filtering module 17 in the minimum noise factor operating state. Herein the matching value is a voltage.

The tuner of the embodiment of the disclosure adopts the MEMS matching tuner instead of the traditional variable capacitors and inductors, fully exerting the superior performance and characteristics of the MEMS device with high integration, low power consumption, a high Q value and wide tuning range, further improving the flexibility of the system and reducing the complexity of the circuit design.

The MEMS adjustable capacitor and inductor changes its voltage through the system controller 13 in FIG. 3, in order to achieve the changes of capacitance and inductance. However, the size of the voltage change amount may be provided by a developer through the user interface 15, or may be stored in the matching state memory 14 by a developer through the user interface 15, and then may be called by the system controller 13 from the matching state memory 14 according to the operating frequency bands of the receiver.

Figure 4:
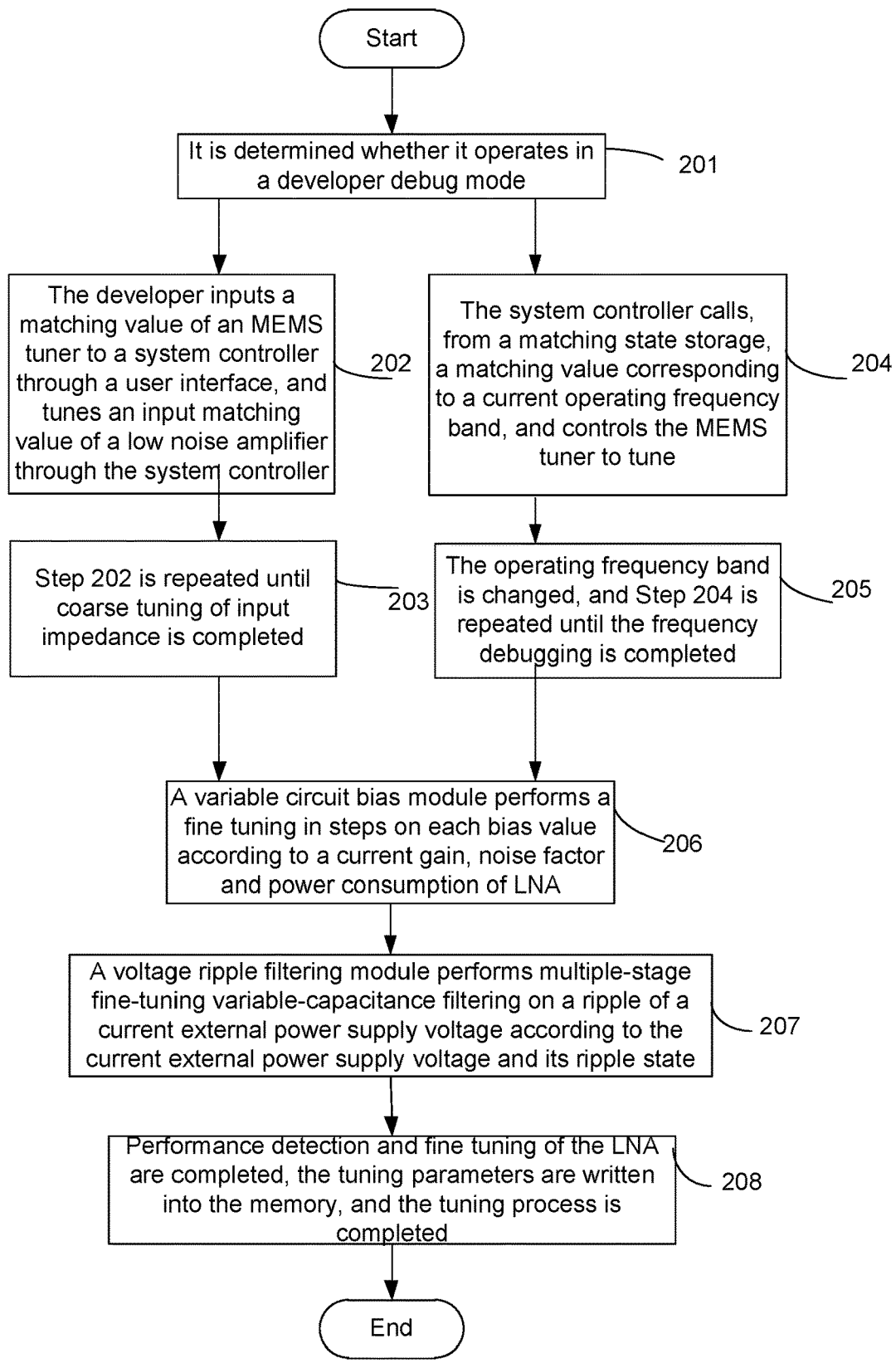
FIG. 4 is a specific operating flow diagram of a multi-frequency tunable low noise amplifier to which an embodiment of the disclosure is applied.

FIG. 4 is an operating flow diagram of a multi-frequency tunable low noise amplifier in the example of the disclosure. As shown in FIG. 4, the operating flow of an embodiment of the disclosure includes the following steps.

Step 201: After the receiver starts to operate, the system determines whether it is in the developer debug mode, and if so, proceed to Step 202; if not, proceed to Step 204.

Step 202: The developer debugs the matching through the user interface on the PC. The matching value input by the user is sent to the system controller through the user interface. The system controller adjusts the matching value of the MEMS tuner according to the matching value.

Step 203: The developer repeats Step 202 until a satisfactory matching value is acquired, and the data, including the frequency band information corresponding to matching, is stored in the matching state memory, and the matching coarse tuning is completed.

Step 204: The system controller calls the corresponding matching value from the matching state memory according to the current operating frequency band of the receiver, and controls the MEMS tuner to tune so that the low noise amplifier operates in the optimal noise performance matching state in the current frequency band.

Step 205: The operating frequency band of the receiver is changed, and Step 204 is repeated to implement the multi-frequency operation of the low noise amplifier.

Step 206: The variable circuit bias module adjusts the various bias values according to the current gain, noise factor and power consumption of the LNA step by step until an optimal operating point is reached.

Step 207: The voltage ripple filtering module performs multiple-stage fine-tuning variable-capacitance filtering on a ripple of a current external power supply voltage according to the current external power supply voltage and its ripple state so as to acquire most noise-free and stable voltage power supply, and the fine tuning is completed.

Step 208: The performance detection and the fine tuning of the LNA are completed, the adjustment parameters are written into the memory, and the adjustment operation is completed.

If the integrated module described in the embodiment of the disclosure may be implemented in the form of a software function module and sold or used as a standalone product, the integrated modules may also be stored in a computer-readable storage medium. Based on this understanding, the technical solution of the embodiment of the disclosure, in essence or for the part making a contribution to the traditional art, may be embodied in the form of a software product, and the computer software product are stored in a storage medium. The storage medium includes a number of instructions so that a computer device (which may be a personal computer, a server, or a network device, etc.) performs all or part of the method described in the various embodiments of the disclosure. However, the above storage medium includes a variety of media such as a USB disk, a mobile hard disk, a Read Only Memory (ROM), a Random Access Memory (RAM), a magnetic disk, or an optical disk, in which a program code can be stored. Thus, embodiments of the disclosure are not limited to any particular combination of hardware and software.

Accordingly, an embodiment of the disclosure further provides a computer storage medium in which a computer program is stored which is used for executing the method for performing multi-frequency tuning of the multi-frequency tunable low noise amplifier according to an embodiment of the disclosure.

The foregoing is merely a preferred embodiment of the disclosure and is not intended to limit the scope of protection of the disclosure.

INDUSTRIAL APPLICABILITY

The embodiment of the disclosure provides an amplifier, wherein the amplifier includes: a system controller and an MEMS matching tuner connected with the system controller; the system controller is arranged to, during a first mode, respond to a first operation implemented by a user via a user interface, to acquire a first matching value obtained according to the first operation, and to output the first matching value to the MEMS matching tuner; the MEMS matching tuner is arranged to be controlled by the system controller, and to perform tuning processing on the amplifier supporting operation in different frequency bands according to the first matching value so that a matching value of the MEMS matching tuner matches a current operating frequency band. The embodiment of the disclosure avoids the contradictions between the performance of the receiving system and the hardware complexity, achieving multi-frequency tunable processing on the low noise amplifier without improving the hardware complexity to ensure the performance of the receiving system.

What is claimed is:

1. A multi-frequency tunable low noise amplifier, comprising: a system controller and a Micro-Electro-Mechanical System (MEMS) matching tuner connected with the system controller, wherein the system controller is arranged to, when detecting that the system controller is in a first mode, respond to a first operation implemented by a user via a user interface, to acquire a first matching value obtained according to the first operation, and to output the first matching value to the MEMS matching tuner, wherein the first mode is a developer debug mode; and the MEMS matching tuner is arranged to be controlled by the system controller, and to perform tuning processing on the amplifier supporting operation in different frequency bands according to the first matching value so that a matching value of the MEMS matching tuner matches a current operating frequency band.

2. The amplifier according to claim 1, further comprising: a wideband low noise amplifier arranged to, under the control of the MEMS matching tuner, perform input impedance matching by the tuning processing that allows the matching value to match the current operating frequency band, so as to support operation in a plurality of different operating frequency bands.

3. The amplifier according to claim 1, wherein the amplifier further comprises:
a variable circuit bias module arranged to perform a bias fine tuning on a wideband low noise amplifier; and/or
a voltage ripple filtering module arranged to perform a voltage fine tuning on the wideband low noise amplifier.

4. The amplifier according to claim 2, wherein the amplifier further comprises:
a variable circuit bias module arranged to perform a bias fine tuning on the wideband low noise amplifier; and/or
a voltage ripple filtering module arranged to perform a voltage fine tuning on the wideband low noise amplifier.

5. A method for performing multi-frequency tuning of a multi-frequency tunable low noise amplifier, the method comprising:
when detecting that a system controller is in a first mode, responding, by the system controller, to a first operation implemented by a user via a user interface to acquire a first matching value obtained according to the first operation, wherein the first mode is a developer debug mode;
outputting, by the system controller, the first matching value to a Micro-Electro-Mechanical System (MEMS) matching tuner; and
performing, by the MEMS matching tuner under the control of the system controller, tuning processing on the amplifier supporting operation in different frequency bands according to the first matching value, so that a matching value of the MEMS matching tuner matches a current operating frequency band.

6. The method according to claim 5, further comprising:
performing, by a wideband low noise amplifier under the control of the MEMS matching tuner, input impedance matching by the tuning processing that allows the matching value to match the current operating frequency band, so as to support operation in a plurality of different operating frequency bands.

7. The method according to claim 5, further comprising:
performing a fine tuning on each bias value according to a current gain, noise factor and power consumption of a wideband low noise amplifier until an optimal operating point is reached.

8. The method according to claim 5, further comprising:
performing multiple-stage fine-tuning variable-capacitance filtering on a ripple of an external power supply voltage according to the external power supply voltage and a ripple state of the external power supply voltage until voltage fluctuation does not exceed +/−1% of the external power supply voltage so as to acquire most noise-free and stable voltage power supply.

9. The method according to claim 6, further comprising:
performing a fine tuning on each bias value according to a current gain, noise factor and power consumption of the wideband low noise amplifier until an optimal operating point is reached.

10. The method according to claim 6, further comprising:
performing multiple-stage fine-tuning variable-capacitance filtering on a ripple of an external power supply voltage according to the external power supply voltage and a ripple state of the external power supply voltage until voltage fluctuation does not exceed +/−1% of the external power supply voltage so as to acquire most noise-free and stable voltage power supply.

11. A multi-frequency tunable low noise amplifier, comprising:
a system controller arranged to, during a second mode, acquire a second matching value corresponding to a current operating frequency band from pre-configured information, and to output the second matching value to a Micro-Electro-Mechanical System (MEMS) matching tuner;
the MEMS matching tuner arranged to be controlled by the system controller, and to perform tuning processing on the amplifier supporting operation in different frequency bands according to the second matching value so that a matching value of the MEMS matching tuner matches the current operating frequency band; and
at least one of:
a variable circuit bias module arranged to perform a bias fine tuning on a wideband low noise amplifier; or
a voltage ripple filtering module arranged to perform a voltage fine tuning on the wideband low noise amplifier.

12. The amplifier according to claim 11, wherein
the wideband low noise amplifier is arranged to, under the control of the MEMS matching tuner, perform input impedance matching by the tuning processing that allows the matching value to match the current operating frequency band, so as to support operation in a plurality of different operating frequency bands.

* * * * *